(12) United States Patent
Luo et al.

(10) Patent No.: US 12,181,794 B2
(45) Date of Patent: Dec. 31, 2024

(54) PHOTOLITHOGRAPHY METHOD

(71) Applicant: THE INSTITUTE OF OPTICS AND ELECTRONICS, THE CHINESE ACADEMY OF SCIENCES, Sichuan (CN)

(72) Inventors: Xiangang Luo, Sichuan (CN); Kaipeng Liu, Sichuan (CN); Yunfei Luo, Sichuan (CN); Shuai Mou, Sichuan (CN); Ping Gao, Sichuan (CN); Zeyu Zhao, Sichuan (CN)

(73) Assignee: THE INSTITUTE OF OPTICS AND ELECTRONICS, THE CHINESE ACADEMY OF SCIENCES, Sichuan (CN)

( * ) Notice: Subject to any disclaimer, the term of this patent is extended or adjusted under 35 U.S.C. 154(b) by 0 days.

(21) Appl. No.: 18/575,719

(22) PCT Filed: Nov. 14, 2022

(86) PCT No.: PCT/CN2022/131663
§ 371 (c)(1),
(2) Date: Dec. 29, 2023

(87) PCT Pub. No.: WO2023/109393
PCT Pub. Date: Jun. 22, 2023

(65) Prior Publication Data
US 2024/0264523 A1      Aug. 8, 2024

(30) Foreign Application Priority Data
Dec. 16, 2021   (CN) .......................... 202111547641.5

(51) Int. Cl.
*G03F 7/20*       (2006.01)
*G03F 1/60*       (2012.01)
(Continued)

(52) U.S. Cl.
CPC .................. *G03F 1/80* (2013.01); *G03F 1/60* (2013.01); *G03F 1/82* (2013.01); *G03F 7/2008* (2013.01)

(58) Field of Classification Search
None
See application file for complete search history.

(56) References Cited

U.S. PATENT DOCUMENTS

2015/0234286 A1*   8/2015  Son ...................... G03F 7/70375
                                                  216/51

FOREIGN PATENT DOCUMENTS

CN        102053491 A  *   5/2011
CN        102096326 A       6/2011
(Continued)

OTHER PUBLICATIONS

WIPO/ISA/CNIPA, International Search Report and Written Opinion issued on Feb. 14, 2023 in PCT/CN2022/131663, 9 pages.
(Continued)

*Primary Examiner* — Martin J Angebranndt
(74) *Attorney, Agent, or Firm* — J. Peter Paredes; Amin Wasserman Gurnani LLP

(57) ABSTRACT

A photolithography method includes: sequentially preparing a functional film layer, a reflective auxiliary imaging film layer and a first photoresist layer which are stacked, on a photolithography substrate; performing photolithography on the first photoresist layer to obtain a first photolithography structure; etching the reflective auxiliary imaging film layer with the first photolithography structure as a masking layer; on the pattern of the reflective auxiliary imaging film layer, sequentially preparing a second photoresist layer and a transmissive auxiliary imaging film layer which stacked; performing surface plasmon photolithography with the pattern of the reflective auxiliary imaging film layer as a mask, (Continued)

removing the transmissive auxiliary imaging film layer, and then developing the second photoresist layer, to obtain a second photolithography structure; and etching the functional film layer, with the second photolithography structure as a masking layer, to obtain a third photolithography structure.

12 Claims, 4 Drawing Sheets

(51) Int. Cl.
  *G03F 1/80* (2012.01)
  *G03F 1/82* (2012.01)

(56) References Cited

FOREIGN PATENT DOCUMENTS

| | | | |
|---|---|---|---|
| CN | 102629073 A | 8/2012 | |
| CN | 103454866 A | 12/2013 | |
| CN | 103872155 A | 6/2014 | |
| CN | 105549336 A * | 5/2016 | |
| CN | 109521657 A * | 3/2019 | |
| CN | 109668631 A | 4/2019 | |
| CN | 109669323 A * | 4/2019 | ........... G03F 7/2022 |
| CN | 109828439 A * | 5/2019 | |
| CN | 111458975 A | 7/2020 | |
| CN | 114217510 A | 3/2022 | |
| JP | 2009-093084 A | 4/2009 | |
| JP | 2009-278091 A | 11/2009 | |
| JP | 2010-507906 A | 3/2010 | |
| JP | 2012-190915 A | 10/2012 | |
| JP | 2013-080866 A | 5/2013 | |
| WO | 2014032304 A1 | 3/2014 | |

OTHER PUBLICATIONS

CNIPA, Notification to Grant Patent Right for Invention of priority application CN2021115476415, Jul. 25, 2022, 3 pages.

Wang, C et al. "Surface plasmon lithography beyond the diffraction limit", Kexue Tongbao/Chinese Science Bulletin. 61. 585-599 (2016).

Japan Patent Office, Decision to Grant a Patent issued in corresponding Japanese Patent Application No. 2023-579740 dated Sep. 6, 2024, 4 pages.

Japan Patent Office, Office Action issued in corresponding Japanese Patent Application No. 2023-579740 dated May 23, 2024, 6 pages.

* cited by examiner

PHOTOLITHOGRAPHY METHOD

The present disclosure application claims priority to PCT application serial no. PCT/CN2022/131663 filed Nov. 14, 2022, which claims priority to the Chinese patent application with the filing No. 202111547641.5 filed on Dec. 16, 2021, the contents of which are incorporated herein by reference in their entireties.

TECHNICAL FIELD

The present disclosure relates to the technical field of super-resolution imaging, in particular to a photolithography (lithography) method.

BACKGROUND ART

Surface plasmas show many novel optical phenomena in sub-wavelength structures, and in recent years, there have been various reports on the application of surface plasmon's singular optical characteristics. Moreover, devices prepared by means of surface plasma (SP) photolithography technology may be smaller in feature size than conventional photolithography methods, and have better photolithography uniformity. At the same time, it can realize the processing of different structural feature sizes at one time, and has the advantages such as high resolution and low requirements for photolithography equipment. For example, the metal-dielectric-metal structure plays an important role in overcoming the diffraction limit optical behavior and has become a typical structure of super-resolution imaging and photolithography.

In the implementation of the conception of the present disclosure, the inventors found that the resolution of SP photolithography is limited due to the presence of optical diffraction effect, and the photolithography structure with higher resolution cannot be obtained.

SUMMARY

In view of this, the present disclosure provides a photolithography method, which includes: sequentially preparing a functional film layer, a reflective auxiliary imaging film layer and a first photoresist layer which are stacked, on a surface of a photolithography substrate; performing photolithography on the first photoresist layer to obtain a first photolithography structure; etching the reflective auxiliary imaging film layer, with the first photolithography structure as a masking layer, to transfer a pattern of the first photolithography structure to the reflective auxiliary imaging film layer; sequentially preparing a second photoresist layer and a transmissive auxiliary imaging film layer which are stacked, on the pattern structure of the reflective auxiliary imaging film layer; performing surface plasma photolithography with the pattern of the reflective auxiliary imaging film layer as a mask, removing the transmissive auxiliary imaging film layer and developing the second photoresist layer to obtain a second photolithography structure; and etching the functional film layer with the second photolithography structure as a masking layer to transfer a pattern of the second photolithography structure to the functional film layer to obtain a third photolithography structure.

According to an embodiment of the present disclosure, the reflective auxiliary imaging film layer and the transmissive auxiliary imaging film layer are prepared by using gold, silver, aluminum, or a material with a negative dielectric constant.

According to an embodiment of the present disclosure, the reflective auxiliary imaging film layer and the transmissive auxiliary imaging film layer are prepared by means of sputtering deposition, evaporation deposition, atomic layer deposition or chemical vapor deposition.

According to an embodiment of the present disclosure, the first photolithography structure is a periodic structure or an aperiodic structure, and the first photolithography structure has a one-dimensional pattern or a two-dimensional pattern.

According to an embodiment of the present disclosure, the first photoresist layer is subjected to photolithography by means of surface plasma photolithography, projection photolithography or electron beam direct writing photolithography.

According to an embodiment of the present disclosure, the reflective auxiliary imaging film layer is etched by means of ion beam etching or reactive ion etching.

According to an embodiment of the present disclosure, an illumination mode of the surface plasma photolithography is vertical illumination or off-axis illumination.

According to an embodiment of the present disclosure, the number of slits and the number of lines in the pattern of the second photolithography structure are twice those of the first photolithography structure.

According to an embodiment of the present disclosure, the functional film layer is prepared by using one of Si, SiC, $SiO_2$, $Si_3N_4$, Ge, ITO, Al, W, Ag and Au; the functional film layer is prepared by means of magnetron sputtering deposition, evaporation deposition, chemical vapor deposition or atomic layer deposition; and the functional film layer is etched by ion beam etching, reactive ion etching or inductively coupled plasma etching.

According to an embodiment of the present disclosure, the reflective auxiliary imaging film layer with a thickness of 10 nm to 100 nm is prepared; the first photoresist layer with a thickness of 10 nm to 100 nm is prepared; the second photoresist layer with a thickness of 10 nm to 100 nm is prepared; and the transmissive auxiliary imaging film layer with a thickness of 5 nm to 50 nm is prepared.

According to an embodiment of the present disclosure, the photolithography substrate is a quartz substrate, a silicon substrate, a germanium substrate, a glass substrate, a sapphire substrate, or an organic thin film substrate; the transmissive auxiliary imaging film layer is removed by a removing method of wet removal, tearing removal after physical adhesion, or ion bombardment removal; and the residual reflective auxiliary imaging film layer and the second photoresist layer after etching are removed by a chemical reaction method or a dissolution method.

Compared with the prior art, in the present disclosure, the diffraction effect of light influencing the photolithography resolution in SP photolithography is changed from the double-sided diffraction effect to the single-sided diffraction effect by using the shielding of the reflective auxiliary imaging film layer material, thereby partially solving the problem of limited resolution in conventional SP photolithography and improving the photolithography resolution.

BRIEF DESCRIPTION OF DRAWINGS

The above and other objectives, features and advantages of the present disclosure will be clearer from the following description of embodiments of the present disclosure with reference to the drawings, in which.

DETAILED DESCRIPTION OF EMBODIMENTS

Figure 1:
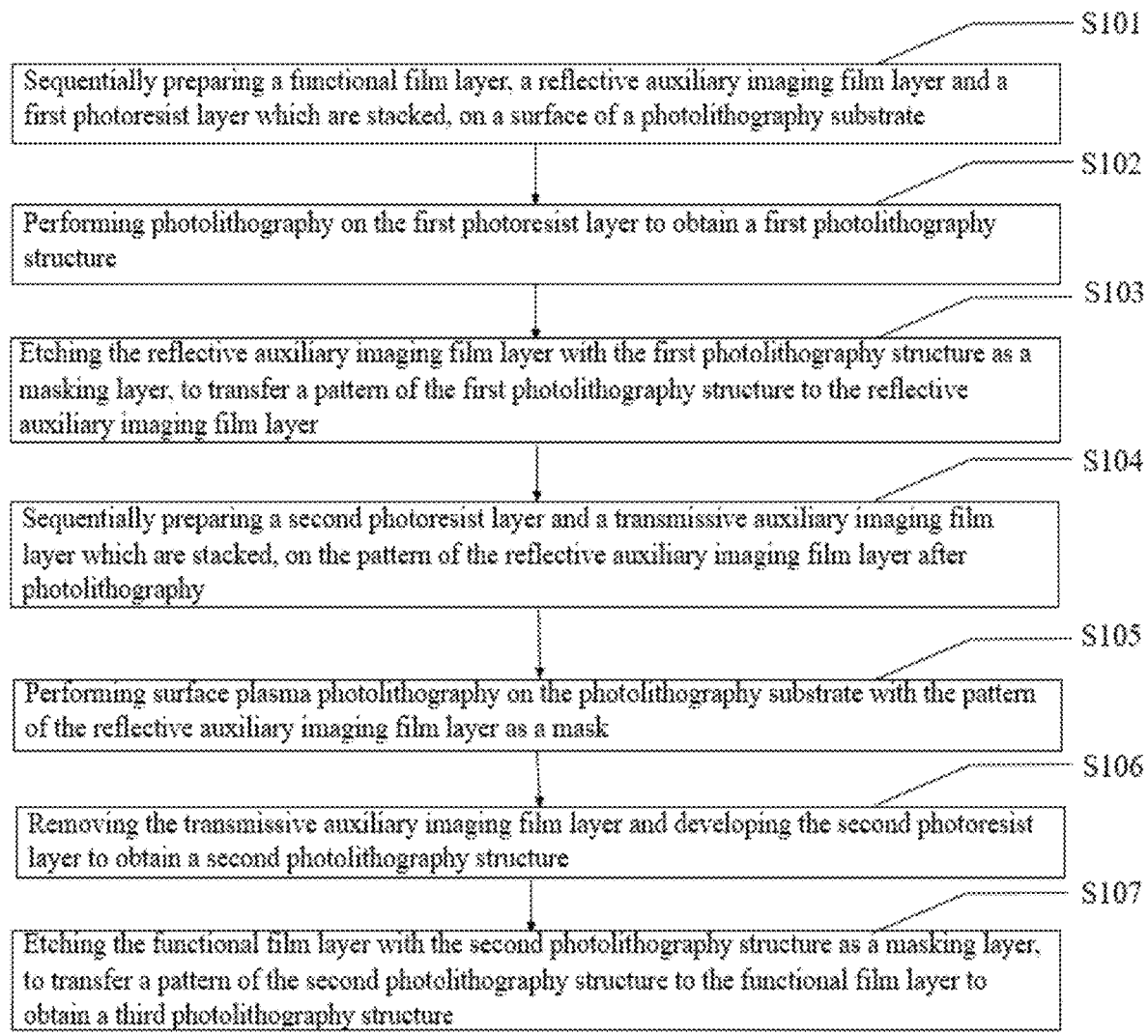
FIG. 1 schematically shows a flowchart of a photolithography method provided by embodiments of the present disclosure.

In order to make the objectives, technical solutions and advantages of the present disclosure clearer, the present disclosure will be further described in detail in conjunction with specific embodiments with reference to the drawings. Obviously, the described embodiments are some rather than all embodiments of the present disclosure. Based on the embodiments of the present disclosure, all other embodiment obtained by a person ordinarily skilled in the art without making creative efforts shall fall within the scope of protection of the present disclosure.

The terms used herein is for the purpose of describing specific embodiments only and is not intended to limit the present disclosure. The terms "include", "contain", etc. used herein indicate the presence of the stated features, steps, operations and/or components, but do not exclude the presence or addition of one or more other features, steps, operations or components.

In the present disclosure, unless otherwise specified and defined, the terms such as "install", "connect" and "fix" should be broadly understood, for example, they may mean fixed connection, detachable connection or integration, may mean mechanical connection, electrical connection or communication with each other, and may mean direct connection, or indirect connection through an intermediate medium, or internal communication between two elements, or interaction between two elements. For those ordinarily skilled in the art, the specific meanings of the above terms in the present disclosure may be understood according to the specific circumstances.

In the description of the present disclosure, it should be understood that an orientation or position relationship indicated by the terms such as "longitudinal", "length", "circumferential", "front", "rear", "left", "right", "top", "bottom", "inside" and "outside" is only based on the orientation or position relationship shown in the drawings, and is only for the convenience of describing the present disclosure and simplifying the description, and does not indicate or imply that the subsystem or element referred to must have a specific orientation, or be constructed and operate in a specific orientation, so it cannot be understood as a limitation on the present disclosure.

Throughout the drawings, the same elements are indicated by the same or similar reference numerals. The conventional structure or construction is omitted where it is likely to cause confusion in the understanding of the present disclosure. Moreover, the shape, size and position relationship of each component in the drawings do not reflect the real size, proportion and actual position relationship. In addition, in Claims, any reference numerals placed between parentheses shall not be constructed as limitations on Claims.

Similarly, in order to simplify the present disclosure and help to understand one or more aspects of the present disclosure, in the above description of exemplary embodiments of the present disclosure, various features of the present disclosure are sometimes grouped together into a single embodiment, figure or description thereof. Descriptions with reference to the expressions such as "one embodiment", "some embodiments", "examples", "specific examples" or "some examples" mean that specific features, structures, materials or characteristics described in conjunction with the embodiment or example are included in at least one embodiment or example of the present disclosure. In this specification, the above schematic expressions of above terms do not necessarily refer to the same embodiment or example. Moreover, the specific features, structures, materials or characteristics described may be combined in any one or more embodiments or examples in a suitable manner.

In addition, the terms "first" and "second" are only intended for descriptive purposes and cannot be understood as indicating or implying importance in relativity or implicitly indicating the number of indicated technical features. Therefore, the features defined as "first" and "second" may include one or more of these features explicitly or implicitly. In the description of the present disclosure, "a plurality of" means at least two, such as two, three, etc., unless otherwise expressly and specifically defined.

FIG. 1 schematically shows a flowchart of a photolithography method provided by embodiments of the present disclosure;

As shown in FIG. 1, the photolithography method may include operations S101 to S107, for example.

In operation S101, a functional film layer 2, a reflective auxiliary imaging film layer 3 and a first photoresist layer 4 which are stacked are sequentially prepared on the surface of a photolithography substrate 1.

In an embodiment of the present disclosure, the photolithography substrate 1 may be a quartz substrate, a silicon substrate, a germanium substrate, a glass substrate, a sapphire substrate, or an organic thin film substrate, etc.

The prepared functional film layer 2 may be made of a dielectric material or metal material such as Si, SiC, $SiO_2$, $Si_3N_4$, Ge, ITO, Al, W, Ag, Au, etc. The preparation of the functional film layer 2 may be performed by means of magnetron sputtering deposition, evaporation deposition, chemical vapor deposition or atomic layer deposition.

The prepared reflective auxiliary imaging film layer 3 may be made of a material including Ag, Al, Au or other materials with a negative dielectric constant, and the preparation method may be means of sputtering deposition, evaporation deposition, atomic layer deposition or chemical vapor deposition.

In the above, the reflective auxiliary imaging film layer 3 with a thickness of 10 nm to 100 nm may be prepared, and the first photoresist layer 4 with a thickness of 10 nm to 100 nm may be prepared.

In operation S102, the first photoresist layer 4 is subjected to photolithography to obtain a first photolithography structure.

In an embodiment of the present disclosure, the first photoresist layer 4 may be subjected to photolithography by means of surface plasma photolithography, projection photolithography or electron beam direct writing photolithography, and the first photolithography structure obtained by the photolithography may be a periodic structure or an aperiodic structure, and the first photolithography structure may have a one-dimensional pattern or a two-dimensional pattern.

In operation S103, the reflective auxiliary imaging film layer 3 is etched with the first photolithography structure as a masking layer, to transfer the photoresist pattern of the first photolithography structure to the reflective auxiliary imaging film layer 3.

In an embodiment of the present disclosure, the reflective auxiliary imaging film layer 3 may be etched by means of ion beam etching or reactive ion etching. After the pattern transfer is completed, the pattern of the reflective auxiliary imaging film layer 3 is the same as that of the first photolithography structure.

In operation S104, a second photoresist layer 5 and a transmissive auxiliary imaging film layer 6 which are stacked are sequentially prepared on the pattern of the reflective auxiliary imaging film layer 3.

In an embodiment of the present disclosure, a second photoresist layer 5 is coated on the pattern of the reflective auxiliary imaging film layer 3. The second photoresist layer 5 may be made of AR series, AZ series, PMMA series or other photosensitive materials, and may have a thickness of 10 nm to 100 nm.

A transmissive auxiliary imaging film layer 6 is continued to be prepared on the second photoresist layer 5. The prepared transmissive auxiliary imaging film layer 6 may be made of Ag, Al, Au or other materials with a negative dielectric constant. The preparation method may be sputtering deposition, evaporation deposition, atomic layer deposition or chemical vapor deposition, and the thickness may be 5 nm to 50 nm.

In operation S105, surface plasma photolithography is performed with the pattern of the reflective auxiliary imaging film layer 3 as a mask.

In an embodiment of the present disclosure, the illumination mode of surface plasma photolithography is vertical illumination or off-axis illumination.

In operation S106, the transmissive auxiliary imaging film layer 6 is removed, and the second photoresist layer 5 is developed to obtain a second photolithography structure.

Figure 2:
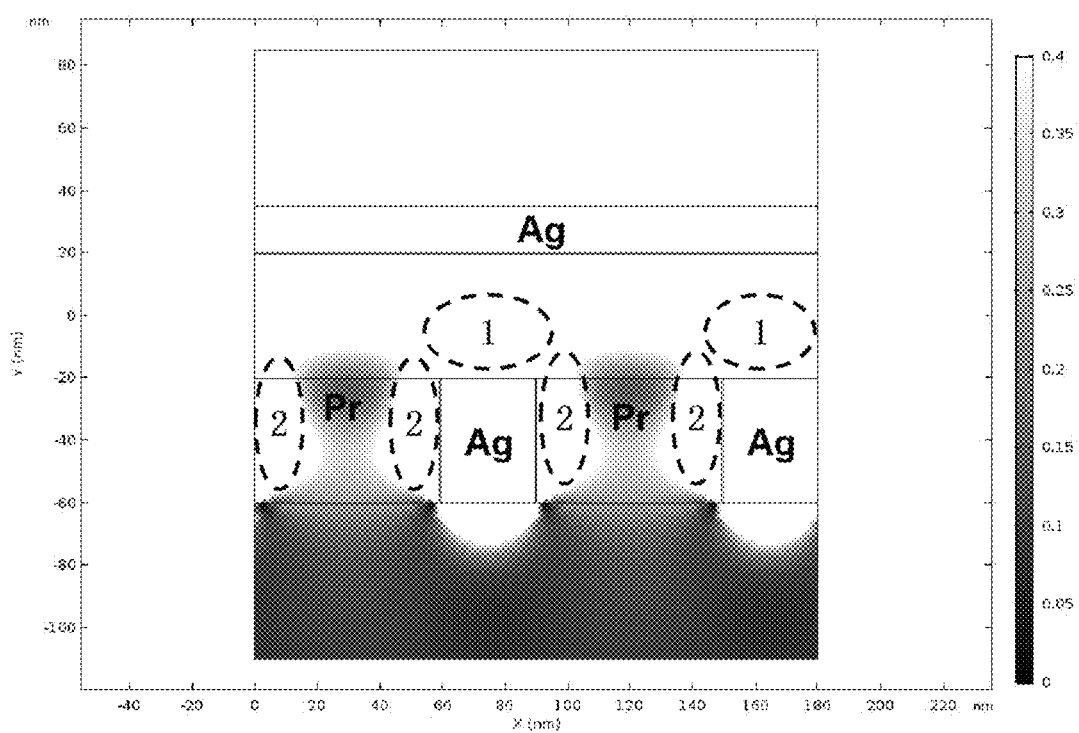
FIG. 2 schematically shows a simulated imaging result of a photolithography structure prepared by a photolithography method provided by embodiments of the present disclosure.

FIG. 2 schematically shows a simulated imaging result of the photolithography structure prepared by a photolithography method of embodiments of the present disclosure.

As shown in FIG. 2, where 1 indicates the area above the reflective auxiliary imaging film layer material structure and 2 is the area at two sides of the reflective auxiliary imaging film layer material structure. Due to the light intensity enhancement effect of the GPG resonant cavity, the light intensities of the area (i.e. area 1) above the reflective auxiliary imaging film layer and the area at two sides (i.e. area 2) of the reflective auxiliary imaging film layer 3 are much greater than those of other areas, and the second photoresist layer 5 in these areas is exposed and removed by development, while the second photoresist layer 5 in other areas is retained.

As a result, new slits are formed at two sides of the reflective auxiliary imaging film layer 3, and new lines are formed by the retained second photoresist layer 5 between two adjacent reflective auxiliary imaging film layer material structures. The side edges of the new slits away from the reflective auxiliary imaging film layer 3 are still be affected by the diffraction effect of light, while the side edges of the new slits near the reflective auxiliary imaging film layer 3 are the edges of the reflective auxiliary imaging film layer 3 which are not limited by the diffraction effect of light. Therefore, the diffraction effect of light affecting the photolithography resolution in SP photolithography is changed from the double-sided diffraction effect to the single-sided diffraction effect, further improving the photolithography resolution.

After the development, the retained second photoresist layer 5 and the reflective auxiliary imaging film layer 3 together form a second photolithography structure. The number of slits in the pattern of the second photolithography structure is twice that of the first photolithography structure, and the number of lines is also twice that of the first photolithography structure.

In operation S107, the functional film layer 2 is etched with the second photolithography structure as a masking layer, to transfer the pattern to the functional film layer 2 to obtain a third photolithography structure.

In an embodiment of the present disclosure, the functional film layer 2 is etched by ion beam etching, reactive ion etching or inductively coupled plasma etching, to transfer the pattern to the functional film layer 2. The reflective auxiliary imaging film layer 3 and the second photoresist layer 5 which are residual after etch transferring are removed by a chemical reaction method or a dissolution method, and the photolithography substrate 1 and the functional film layer 2 are not damaged in the removal process, so that a third photolithography structure on the functional film layer is obtained on the surface of the photolithography substrate, and the pattern of the third photolithography structure on the functional film layer is the same as that of the second photolithography structure.

After that, the third photolithography structure on the functional film layer may also be used as a masking layer, to etch the photolithography substrate and obtain the corresponding substrate pattern.

Therefore, in the photolithography method provided by the embodiment of the present disclosure, the diffraction effect of light influencing the photolithography resolution in SP photolithography is changed from the double-sided diffraction effect to the single-sided diffraction effect by using the shielding of the reflective auxiliary imaging film layer material, thereby partially solving the problem of limited resolution in conventional SP photolithography, and a super-resolution imaging structure can be obtained, thereby achieving good imaging quality in the imaging layer.

In order to further elaborate the photolithography method provided by the embodiments of the present disclosure, several examples are listed below.

Example 1

FIG. 3(*a*)-FIG. 3(*j*) schematically show structural diagrams corresponding to flows of the photolithography method provided in Example 1 of the present disclosure.

As shown in FIG. 3(*a*)-FIG. 3(*j*), firstly, a layer of Si film was prepared, as a functional film layer 2, on the surface of the quartz photolithography substrate. Then, an Ag film with a thickness of $d_1=40$ nm was prepared on the Si film, as the reflective auxiliary imaging film layer 3. A first photoresist layer 4 (193 nm deep ultraviolet photoresist) was coated on the Ag film, and the thickness of the first photoresist layer 4 was 100 nm. The corresponding structure is shown in FIG. 3(*a*).

Next, 193 nm projection photolithography was performed on the first photoresist layer 4 to obtain a first photolithography structure composed of the first photoresist layer 4. The first photolithography structure was a one-dimensional grating structure with a period of 88 nm. The corresponding structure is shown in FIG. 3(*b*).

Figure 3A:
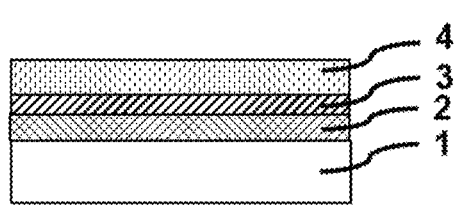
FIG. 3(a)-FIG. 3(j) schematically show structural diagrams corresponding to flows in the photolithography method provided in Example 1 of the present disclosure.
Figure 3F:
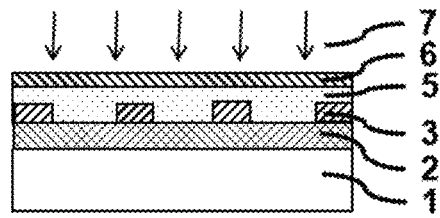
Figure 3B:
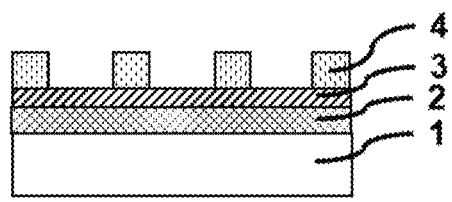
Figure 3G:
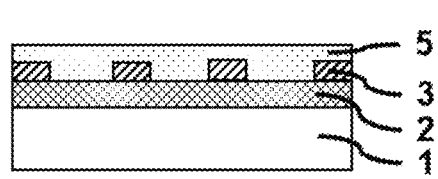
Figure 3C:
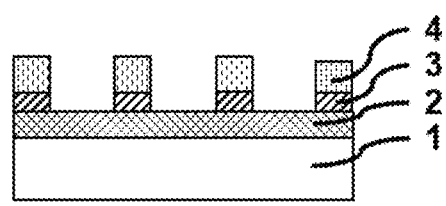

Next, with the photoresist of the first photolithography structure as a masking layer, ion beam etching (IBE) was performed on the Ag film, to transfer the photoresist pattern of the first photolithography structure to the Ag film, to obtain the pattern of the reflective auxiliary imaging film layer. The corresponding structure is shown in FIG. 3(c).

Figure 3H:
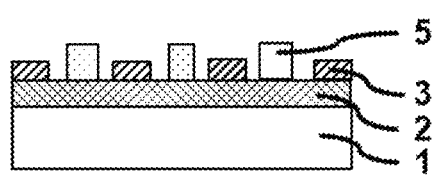
Figure 3D:
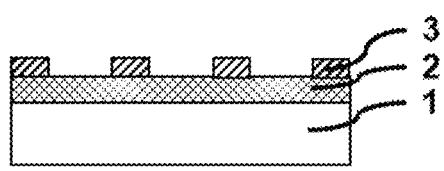

Next, the first photoresist layer 4 residual after etching was removed. The corresponding structure is shown in FIG. 3(d).

Figure 3I:
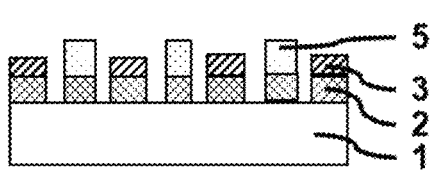
Figure 3E:
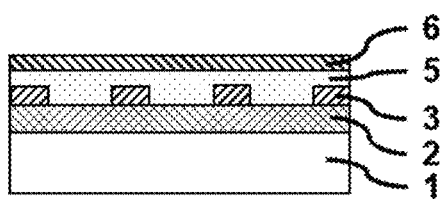

Next, a second photoresist layer 5 (PHS photoresist) was coated on the pattern of the reflective auxiliary imaging film layer 3, and the thickness $d_2$ of the second photoresist layer 5 was 30 nm. On the second photoresist layer 5, it continued to prepare a layer of Ag film as a transmissive auxiliary imaging film layer 6 with a thickness of $d_3$=20 nm. The corresponding structure is shown in FIG. 3(e).

Next, surface plasma photolithography was performed on the photolithography substrate 1, and the mask was the pattern of the reflective auxiliary imaging film layer 3 on the photolithography substrate. The corresponding structure is shown in FIG. 3(f).

Next, the transmissive auxiliary imaging film layer 6 was removed. The corresponding structure is shown in FIG. 3(g).

Next, the second photoresist layer 5 was developed. Due to the light intensity enhancement of the GPG resonant cavity, the light intensities in the area above the reflective auxiliary imaging film layer material structure and the area at two sides of the reflective auxiliary imaging film layer material structure were much higher than those in other areas, and the second photoresist layer 5 in these areas was exposed and removed by development, while the second photoresist layer 5 in other areas was retained. The corresponding structure is shown in FIG. 3(h).

Next, the second photolithography structure was subjected to etch transferring to transfer the structure to the functional film layer 2. The corresponding structure is shown in FIG. 3(i).

Figure 3J:
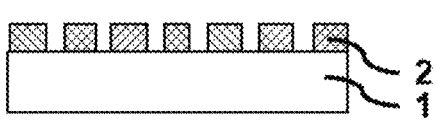

Finally, the reflective auxiliary imaging film layer material Ag film and the second photoresist layer 5 which were residual on the photolithography substrate were removed by nitric acid chemical reaction and acetone dissolution respectively, so that the third photolithography structure with a period of 44 nm was prepared on the functional film layer 2 on the surface of the photolithography substrate 1. The corresponding structure is shown in FIG. 3(j).

Example 2

FIG. 4(a)-FIG. 4(j) schematically show structural diagrams corresponding to flows of the photolithography method provided in Example 2 of the present disclosure.

Figure 4A:
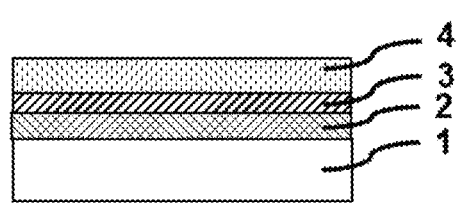
FIG. 4(a)-FIG. 4(j) schematically show structural diagrams corresponding to flows in the photolithography method provided in Example 2 of the present disclosure.

As shown in FIG. 4(a)-FIG. 4(j), firstly, a layer of $SiO_2$ was prepared on the surface of a silicon photolithography substrate, as a functional film layer 2. Then, an Ag film with a thickness of $d_1$=40 nm was prepared on the $SiO_2$ film, as the reflective auxiliary imaging film layer 3, and a first photoresist layer 4 (PHS photoresist) was coated on the Ag film, with the first photoresist layer 4 having a thickness of 40 nm. Then, a surface Ag film with a thickness of 15 nm was evaporated on the first photoresist layer 4. The corresponding structure is shown in FIG. 4(a).

Figure 4F:
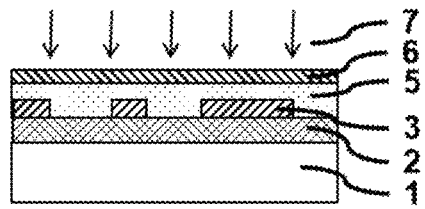
Figure 4B:
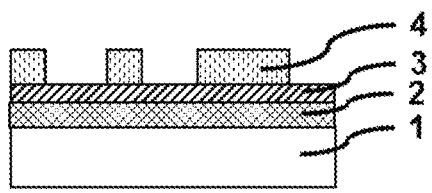

Next, SP photolithography was performed on the first photoresist layer 4, and the first photolithography structure composed of PHS photoresist was obtained after removing the surface Ag film and performing development. The first photolithography structure was an aperiodic structure with the line center spacing of 100 nm to 500 nm. The corresponding structure is shown in FIG. 4(b).

Figure 4G:
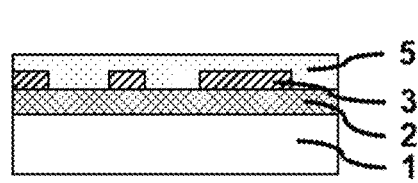
Figure 4C:
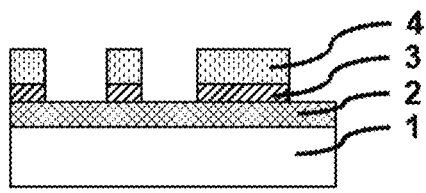
Figure 4H:
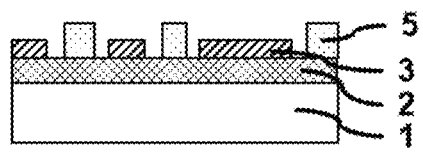
Figure 4D:
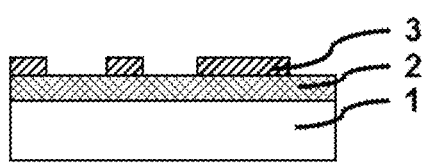

Next, with the photoresist of the first photolithography structure as a masking layer, ion beam etching (IBE) was performed on the Ag film, and the photoresist pattern of the first photolithography structure was transferred to the Ag film to obtain the pattern of the reflective auxiliary imaging film layer. The corresponding structure is shown in FIG. 4(c). Next, the first photoresist layer 4 residual after etching was removed. The corresponding structure is shown in FIG. 4(d).

Figure 4I:
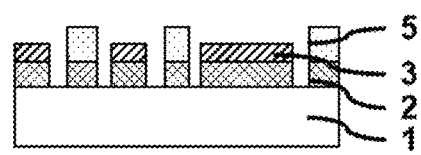
Figure 4E:
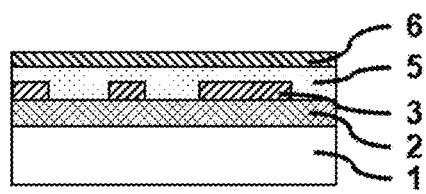

Next, a second photoresist layer 5 (K4 photoresist) was coated on the structure of the reflective auxiliary imaging film layer material 3, and the thickness $d_2$ of the second photoresist layer 5 was 20 nm. On the second photoresist layer 5, it continued to prepare a layer of Ag film as a transmissive auxiliary imaging film layer 6 with a thickness of $d_3$=15 nm. The corresponding structure is shown in FIG. 4(e).

Next, surface plasma photolithography was performed on the photolithography substrate 1, and the mask was the pattern of the reflective auxiliary imaging film layer 3 on the photolithography substrate. The corresponding structure is shown in FIG. 4(f). Next, the transmissive auxiliary imaging film layer 6 was removed. The corresponding structure is shown in FIG. 4(g).

Next, the second photoresist layer 5 was developed. Due to the light intensity enhancement of the GPG resonant cavity, the light intensities in the area above the reflective auxiliary imaging film layer material structure and the area at two sides of the reflective auxiliary imaging film layer material structure were much higher than those in other areas, and the second photoresist layer 5 in these areas was exposed and removed by development, while the second photoresist layer 5 in other areas was retained. The retained second photoresist layer 5 and the reflective auxiliary imaging film layer 3 structure together formed a second photolithography structure, and the number of pattern slits in the second photolithography structure was twice that of the first photolithography structure, and the number of lines was also twice that of the first photolithography structure. The second photolithography structure was an aperiodic structure with a line center spacing of 50 nm to 250 nm. The corresponding structure is shown in FIG. 4(h).

Next, the second photolithography structure was subjected to etch transferring, to transfer the structure to the functional film layer 2. The corresponding structure is shown in FIG. 4(i).

Figure 4J:

Finally, the reflective auxiliary imaging film layer material Ag film and the second photoresist layer 5 which were residual on the photolithography substrate were removed by nitric acid chemical reaction and acetone dissolution respectively, so that the third photolithography structure with a period of 50 nm to 250 nm was prepared on the functional film layer 2 on the surface of the photolithography substrate 1. The corresponding structure is shown in FIG. 4(j).

Example 3

Firstly, a layer of $Si_3N_4$ film was prepared on the surface of the glass photolithography substrate, as the functional film layer 2. Then, an Al film with a thickness of $d_1$=50 nm was prepared on the $Si_3N_4$ film, as the reflective auxiliary imaging film layer 3. A first photoresist layer 4 (PHS photoresist) was coated on the Al film, and the thickness $d_2$ of the first photoresist layer 4 was 20 nm.

Next, the first photoresist layer 4 was subjected to electron beam direct writing, and then development, to obtain the first photolithography structure composed of PHS photoresist. The first photolithography structure was an L-shaped grating structure with a line center spacing of 100 nm.

Next, with the photoresist of the first photolithography structure as a masking layer, ICP etching was performed on the Al film, and the photoresist pattern of the first photolithography structure was transferred to the Al film to obtain the pattern of the reflective auxiliary imaging film layer 3.

Next, a second photoresist layer 5 (K9 photoresist) was coated on the pattern of the reflective auxiliary imaging film layer 3, and the thickness $d_2$ of the second photoresist layer 5 was 20 nm. On the second photoresist layer 5, it continued to prepare a layer of Al film as a transmissive auxiliary imaging film layer 6 with a thickness of $d_4$=10 nm.

Next, surface plasma photolithography was performed on the photolithography substrate 1, and the mask was the pattern of the reflective auxiliary imaging film layer 3 on the photolithography substrate.

Next, the transmissive auxiliary imaging film layer 6 was removed.

Next, the second photoresist layer 5 was developed. Due to the light intensity enhancement of the GPG resonant cavity, the light intensities in the area above the reflective auxiliary imaging film layer material structure and the area at two sides of the reflective auxiliary imaging film layer material structure were much higher than those in other areas, and the second photoresist layer 5 in these areas was exposed and removed by development, while the second photoresist layer 5 in other areas was retained. The retained second photoresist layer 5 and the reflective auxiliary imaging film layer 3 together formed a second photolithography structure, the number of pattern slits in the second photolithography structure was twice that of the first photolithography structure, and the number of lines was also twice that of the first photolithography structure. The second photolithography structure was an L-shaped grating structure with a line center spacing of 50 nm.

Next, the second photolithography structure was subjected to etch transferring, to transfer the structure to the functional film layer 2.

Finally, the reflective auxiliary imaging film layer material Al film and the second photoresist layer 5 which were residual on the photolithography substrate were removed by nitric acid chemical reaction and acetone dissolution respectively, so that the L-shaped third photolithography structure with a line center spacing of 50 nm was prepared on the functional film layer 2 on the surface of the photolithography substrate 1.

To sum up, in the photolithography method provided by the embodiments of the present disclosure, the diffraction effect of light influencing the photolithography resolution in SP photolithography is changed from the double-sided diffraction effect to the single-sided diffraction effect by using the shielding of the reflective auxiliary imaging film layer material, thereby partially solving the problem of limited resolution in conventional SP photolithography and improving the photolithography resolution.

The specific embodiments described above further elaborate the objectives, technical solutions and beneficial effects of the present disclosure. It should be understood that the above are only specific embodiments of the present disclosure and are not intended to limit the present disclosure. Any modification, equivalent substitution, improvement, etc. made within the spirit and principle of the present disclosure should fall within the scope of protection of the present disclosure.

What is claimed is:

1. A photolithography method, comprising:
    sequentially preparing, on a surface of a photolithography substrate, a functional film layer, a reflective auxiliary imaging film layer and a first photoresist layer which are stacked;
    performing photolithography on the first photoresist layer to obtain a first photolithography structure;
    etching the reflective auxiliary imaging film layer with the first photolithography structure as a masking layer, to transfer a pattern of the first photolithography structure to the reflective auxiliary imaging film layer;
    sequentially preparing, on the pattern of the reflective auxiliary imaging film layer, a second photoresist layer and a transmissive auxiliary imaging film layer which are stacked;
    performing surface plasmon photolithography with the pattern of the reflective auxiliary imaging film layer as a mask, removing the transmissive auxiliary imaging film layer and developing the second photoresist layer to obtain a second photolithography structure, wherein the surface plasmon photolithography is controlled by a cavity between the transmissive auxiliary imaging film layer and the patterned reflective auxiliary imaging film layer; and
    etching the functional film layer with the second photolithography structure as a masking layer, to transfer a pattern of the second photolithography structure to the functional film layer to obtain a third photolithography structure.

2. The photolithography method according to claim 1, wherein the reflective auxiliary imaging film layer and the transmissive auxiliary imaging film layer are prepared by using gold, silver, aluminum, or a material with a negative dielectric constant.

3. The photolithography method according to claim 2, wherein the reflective auxiliary imaging film layer and the transmissive auxiliary imaging film layer are prepared by sputtering deposition, evaporation deposition, atomic layer deposition or chemical vapor deposition.

4. The photolithography method according to claim 1, wherein the reflective auxiliary imaging film layer and the transmissive auxiliary imaging film layer are prepared by sputtering deposition, evaporation deposition, atomic layer deposition or chemical vapor deposition.

5. The photolithography method according to claim 1, wherein the first photolithography structure is a periodic structure or an aperiodic structure, and the first photolithography structure has a one-dimensional pattern or a two-dimensional pattern.

6. The photolithography method according to claim 1, wherein the first photoresist layer is subjected to photolithography by surface plasmon photolithography, projection photolithography or electron beam direct writing photolithography.

7. The photolithography method according to claim 1, wherein the reflective auxiliary imaging film layer is etched by ion beam etching or reactive ion etching.

8. The photolithography method according to claim 1, wherein an illumination mode of the surface plasmon photolithography is vertical illumination or off-axis illumination.

9. The photolithography method according to claim 1, wherein a number of slits and a number of lines in the pattern of the second photolithography structure are twice those of the first photolithography structure.

10. The photolithography method according to claim 1, wherein the functional film layer is prepared by using one of Si, SiC, $SiO_2$, $Si_3N_3$, Ge, ITO, Al, W, Ag and Au;

the functional film layer is prepared by magnetron sputtering deposition, evaporation deposition, chemical vapor deposition or atomic layer deposition; and the functional film layer is etched by ion beam etching, reactive ion etching or inductively coupled plasma etching.

11. The photolithography method according to claim 1, wherein the reflective auxiliary imaging film layer with a thickness of 10 nm to 100 nm is prepared;

the first photoresist layer with a thickness of 10 nm to 100 nm is prepared;

the second photoresist layer with a thickness of 10 nm to 100 nm is prepared; and the transmissive auxiliary imaging film layer with a thickness of 5 nm to 50 nm is prepared.

12. The photolithography method according to claim 1, wherein the photolithography substrate is a quartz substrate, a silicon substrate, a germanium substrate, a glass substrate, a sapphire substrate, or an organic thin film substrate;

the transmissive auxiliary imaging film layer is removed by a removing method of wet removal, tearing removal after physical adhesion, or ion bombardment removal; and the reflective auxiliary imaging film layer and the second photoresist layer which are residual after etching are removed by a chemical reaction method or a dissolution method.

\* \* \* \* \*